(12) United States Patent
Yuge

(10) Patent No.: US 7,903,226 B2
(45) Date of Patent: Mar. 8, 2011

(54) LIQUID CRYSTAL DISPLAY DEVICE AND METHOD OF MAKING THE SAME

(75) Inventor: Kazuyuki Yuge, Kanagawa (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 1087 days.

(21) Appl. No.: 11/653,259

(22) Filed: Jan. 16, 2007

(65) Prior Publication Data

US 2007/0171354 A1  Jul. 26, 2007

(30) Foreign Application Priority Data

Jan. 26, 2006  (JP) ................. 2006-017871

(51) Int. Cl.
*G02F 1/1333* (2006.01)
*G02F 1/1345* (2006.01)

(52) U.S. Cl. .................... 349/161; 349/151
(58) Field of Classification Search ............ 349/161
See application file for complete search history.

(56) References Cited

U.S. PATENT DOCUMENTS

| 5,130,832 A * | 7/1992 | Kawaguchi et al. ............ 349/56 |
| 7,303,315 B2 * | 12/2007 | Ouderkirk et al. ............ 362/294 |
| 2005/0259039 A1 * | 11/2005 | Kim et al. ...................... 345/60 |
| 2006/0001821 A1 * | 1/2006 | Dewa et al. .................. 349/150 |

FOREIGN PATENT DOCUMENTS

| JP | 3-57248 | 3/1991 |
| JP | 10-214045 | 8/1998 |
| JP | 2002-083907 | 3/2002 |

* cited by examiner

*Primary Examiner* — David Nelms
*Assistant Examiner* — Nathanael R Briggs
(74) *Attorney, Agent, or Firm* — Young & Thompson

(57) ABSTRACT

Disclosed are a liquid crystal display device 10 and a method of making such liquid crystal display device that improves display quality by providing heat dissipation pattern 4 for effectively dissipating heat generated by the driver ICs 2. The heat dissipation pattern 4 is formed on a glass substrate of a liquid crystal panel 1 along one side thereof so as to minimize non-uniform thermal distribution on the liquid crystal panel 1 at locations adjacent to and distant from the driver ICs 2.

17 Claims, 5 Drawing Sheets

LIQUID CRYSTAL DISPLAY DEVICE AND METHOD OF MAKING THE SAME

FIELD OF THE INVENTION

This application claims benefits of Japanese Patent Application No. 2006-017871 filed on Jan. 26, 2006, the contents of which are incorporated by the reference.

The present invention relates generally to a liquid crystal display device (LCD) and a method of making the same, more specifically to a liquid crystal display device in which driver ICs are mounted on a glass of a liquid crystal panel of such liquid crystal display device.

BACKGROUND OF THE INVENTION

A COG (Chip On Glass) technology for a mounting driver IC on a glass of a liquid crystal panel is gaining popularity in compact liquid crystal display panels to be used for cellular phones or the like. However, a plurality of driver ICs are required in case of applying such COG technology to medium or large size liquid crystal display devices.

As liquid crystal panels become larger, there encounters such problems as increasing loads of driver ICs and heat generated in such driver ICs due to increased power consumption. Generation of heat by the driver ICs leads to poor display quality due to different heat distribution between locations of the liquid crystal panel adjacent to the driver ICs and distant from such driver ICs, thereby causing local changes in performance of the liquid crystal panel and ultimately degradation in display quality.

Moreover, increased heat generated by the driver ICs causes de-rating of the driver ICs and poor reliability of the driver ICs.

Prior art to alleviate such problems due to increased heat generation of the driver ICs in the COG technology are proposed in various publications such as JPA2002-83907 entitled "semiconductor device, substrate, and liquid crystal display and plasma display using such substrate" (a first reference), JPA10-214045 entitled "image display device" (a second reference) and the like.

The first reference discloses a technology of providing a heat dissipation plate on the driver ICs. On the other hand, the second reference discloses a technology of providing a heat conductive sheet between driver ICs for a liquid crystal and a front metal case.

However, even the technologies as disclosed in the first and second references require additional members for enhancing heat dissipation, thereby resulting in cost increase.

Furthermore, in the technology as disclosed in the first reference, it is necessary to add a coating step of a protection film for providing the heat dissipation plate. Such additional step in the manufacturing process results in increased cost of the product.

SUMMARY OF THE INVENTION

It is therefore an object of the present invention to provide a cost advantageous liquid crystal display device employing the COG technology but capable of dissipating the heat generated by the driver ICs and reducing degradation of display quality such as display irregularity or the like due to non-uniform heat distribution.

It is another object of the present invention to provide a method of making such liquid crystal display device.

In order to achieve the above objectives, the liquid crystal display device according to the present invention features in the provision of heat dissipation pattern formed on a glass substrate of a liquid crystal panel in such a manner to conduct and dissipate the heat generated by the adjacent driver ICs. The heat dissipation pattern may also be connected to (or thermally contacted with) a circuit board for carrying a driving circuit for supplying driving signals to the driver ICs.

On the other hand, a method of making a liquid crystal display device according to the present invention features in forming heat dissipation pattern on a glass substrate of a liquid crystal panel simultaneously with forming an array of the liquid crystal panel using the same material.

According to an aspect of the present invention, there is provided a liquid crystal display device having a generally rectangular liquid crystal panel and a circuit board connected to the liquid crystal panel at least one side thereof, comprising: driver ICs mounted on a glass substrate of the liquid crystal panel at a spaced relationship along the one side for driving the liquid crystal panel; and a heat dissipation pattern formed on the glass substrate of the liquid crystal panel adjacent to the driver ICs for conducting heat generated by the driver ICs.

The heat dissipation pattern is in the form of film of a thermally conductive material. The heat dissipation pattern is made from the same material as an array of the liquid crystal panel. The heat dissipation pattern is made of a heat conductive electrically conductive material and a fixed potential is applied to the heat dissipation pattern. The heat dissipation pattern is formed in such a manner to connect adjacent driver ICs. The heat dissipation pattern is formed in such a manner to be connected to the circuit board. The heat dissipation pattern is formed in such a manner to connect adjacent ICs and the circuit board. Wiring pattern for the driver ICs is formed by way of an insulation layer underneath the heat dissipation pattern.

According to another aspect of the present invention, there is provided a method of making a liquid crystal display device including a generally rectangular liquid crystal panel, driver ICs for driving the liquid crystal panel and a circuit board for carrying a driving circuit for supplying driving signals to the driver ICs, comprising the steps of: forming an array and heat dissipation pattern on a glass substrate of the liquid crystal panel; connecting the circuit board to at least one side of the glass substrate of the liquid crystal panel; and mounting the driver ICs along the one side of the glass substrate of the liquid crystal panel in such a manner that the heat dissipation pattern is disposed between the adjacent driver ICs.

The heat dissipation pattern and the array of the liquid crystal panel are formed simultaneously using the same material. In the method, further comprises the step of conducting the heat generated by the driver ICs to the circuit board by way of the heat dissipation pattern.

The liquid crystal display device having one or more driver ICs mounted on a glass substrate of the liquid crystal panel is provided with a heat dissipation pattern of good heat conductive characteristic at locations adjacent to the driver ICs, thereby exhibiting following practical advantages:

A first advantage is to restrict temperature rise of the driver ICs while suppressing increase of manufacturing cost. This is because a heat dissipation pattern having better heat conductive performance than the glass substrate constituting the liquid crystal panel is formed adjacent to the driver ICs or the heat dissipation pattern is connected to adjacent driver ICs, thereby dissipating the heat generated by the driver ICs.

A second advantage is to suppress degradation of display quality due to display irregularity or the like as a result of localized heat generation of the liquid crystal panel. This is because thermal distribution of the liquid display panel is made uniform between locations adjacent to and distant from the driver ICs.

BRIEF DESCRIPTION OF THE DRAWINGS

In the accompanying drawings.

DESCRIPTION OF THE PREFERRED EMBODIMENTS

Now, preferred embodiments of the liquid crystal display device according to the present invention will be described in detail with reference to the accompanying drawings.

Figure 1:
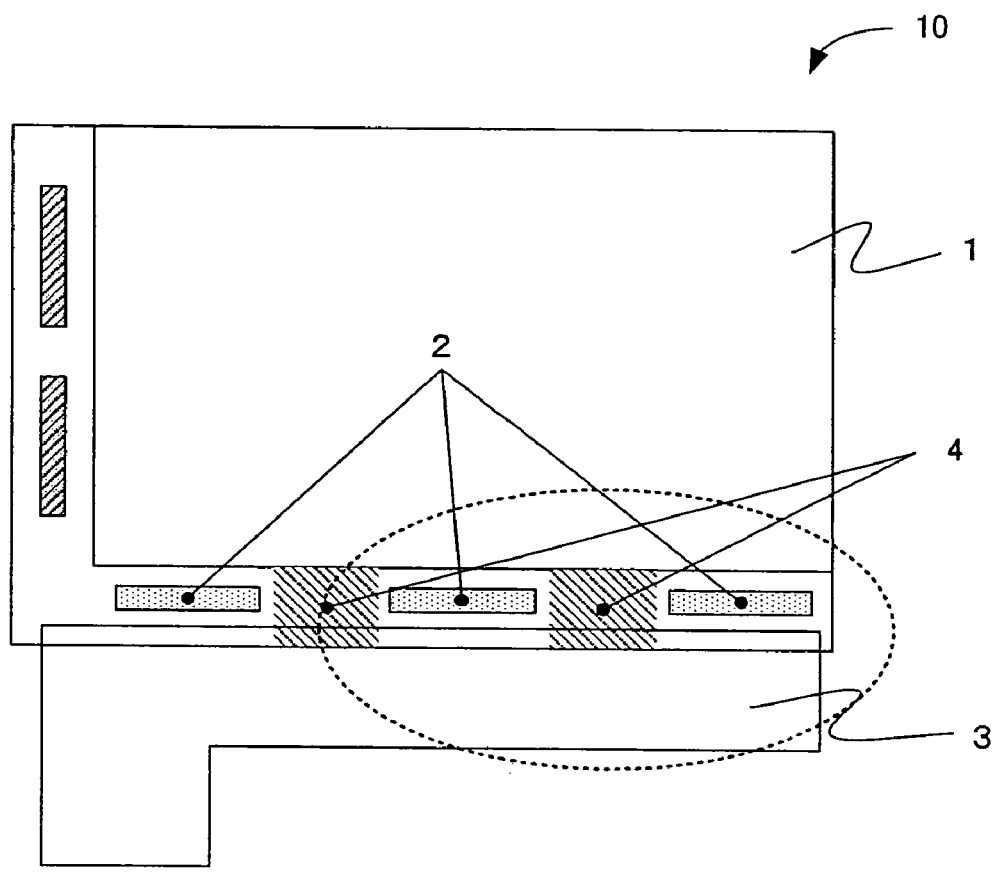
FIG. 1 is a simplified drawing to show one example of the liquid crystal display device according to the present invention.

FIG. 1 is a simplified drawing to show one example of the liquid crystal display device according to the present invention. A description will be made on geometry of a heat dissipation pattern 4 in case of mounting driver ICs 2 on a glass substrate of a liquid crystal panel 1 by the COG technology.

As illustrated in FIG. 1, the liquid crystal display device 10 according to the present invention includes the heat dissipation pattern 4 of good heat conductive characteristic formed at locations adjacent to one or more driver ICs 2. The heat dissipation pattern 4 is thermally connected to adjacent driver ICs 2 and the heat dissipation pattern 4 is thermally connected to a circuit board, e.g., an FPC (Flexible Printed Circuit) 3 that carries a driving circuit for supplying driving signals to the driver ICs 2. The liquid crystal display device 10 having the above configuration features in that heat generated by the driver ICs 2 is effectively conducted to the heat dissipation pattern 4 and the FPC 3.

It is to be noted that the heat dissipation pattern 4 is formed using the same material as the material (e.g., aluminum or the like) that is commonly used in array process in the typical liquid crystal panel 1. This does not increase manufacturing cost and has better heat conductive characteristic as compared to the glass substrate, thereby improving heat dissipation performance of the driver ICs 2. Moreover, the heat dissipation pattern 4 helps to suppress temperature rise due to heat generated by the driver ICs 2, thereby reducing non-uniform thermal distribution on the liquid crystal panel 1 at locations adjacent to the driver ICs and distant from them. This means to suppress local display irregularity on the liquid display panel 1 and degradation of display quality.

Although additional member such as a heat dissipation plate or a heat conductive sheet that is not normally used in typical liquid crystal display devices is required as countermeasures for heat dissipation of driver ICs in prior art that are disclosed in the aforementioned first and second references, the present invention enables one to make the heat dissipation pattern 4 without increasing the production cost and also to reduce non-uniformity in thermal distribution. Because the heat dissipation pattern 4 can be formed using the same material as the array of the liquid crystal panel 1 and at the same manufacturing process (i.e., the array making process) of the liquid crystal panel 1 as described hereinbefore.

Now, the liquid crystal display device 10 as illustrated in FIG. 1 will be described in detail hereunder. The liquid crystal display device 10 as illustrated in FIG. 1 comprises at least the liquid crystal panel 1, the driver ICs 2, the FPC 3 and the heat dissipation pattern 4. The heat dissipation pattern 4 is formed on the glass substrate constituting the liquid crystal panel 1 adjacent to the driver ICs 2 using the same material as the array material (e.g., aluminum) of the liquid crystal panel 1.

In other words, the liquid crystal panel 1 is formed on the glass substrate, while the driver ICs 2 are mounted at the peripheral area of the liquid crystal panel 1. Moreover, the driver ICs 2 are connected to a circuit pattern for inputting/outputting power and signals, i.e., the FPC 3 that is a circuit board on which a driving circuit is formed for supplying driving signals.

Figure 2:
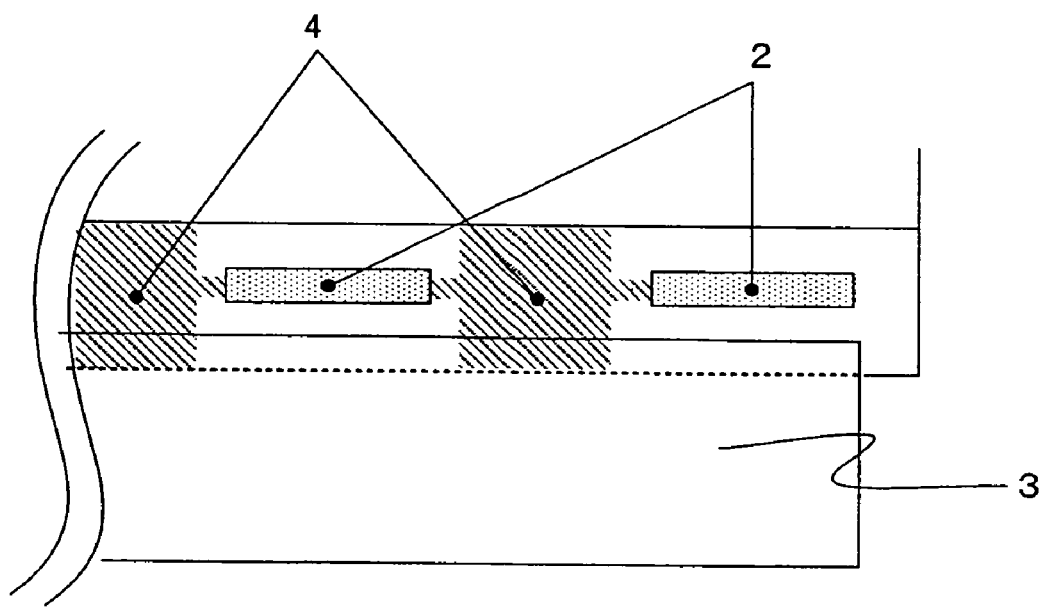
FIG. 2 is a first embodiment showing in a magnified scale a part adjacent to the driver ICs as shown in FIG. 1.

FIG. 2 is a first embodiment showing in a magnified scale apart adjacent to the driver ICs 2 as shown in FIG. 1. As shown in FIG. 2, the heat dissipation pattern 4 is formed in such a manner to connect or couple adjacent driver ICs 2 and also to the FPC 3.

Now, the operation of the liquid crystal display device 10 as shown in FIGS. 1 and 2 will be described. In the operating condition of the liquid crystal display device 10 as shown in FIG. 1, the driver ICs 2 are driven and generate heat, thereby raising temperature of the driver ICs 2 as well as the areas adjacent to the driver ICs 2. The heat generated by the driver ICs 2 is conducted to the nearby heat dissipation pattern 4 connected thereto and also conducted to the FPC 3 by way of the heat dissipation pattern 4. Generally, the FPC 3 has a large area of a metal pattern of excellent thermal conductive characteristic, thereby acting as an effective heat dissipation member.

As apparent from the above description, the driver ICs 2 are provided with excellent heat dissipation performance, thereby enabling to suppress temperature rise of the driver ICs 2 as well as adjacent areas thereof. Since the temperature of the heat dissipation pattern 4 itself rises by the heat generated by the driver ICs 2, thereby effectively minimizing non-uniformity in thermal distribution of the liquid crystal panel 1 at locations of the driver ICs 2, adjacent to the driver ICs 2 and distant from them.

As a result of employing such unique construction, the liquid crystal display device 10 according to the present invention exhibits the following advantages.

By employing the particular construction of connecting the driver ICs 2 to the adjacent heat dissipation pattern 4 having better thermal conductive performance than the glass substrate that constitutes the liquid crystal panel 1 and also connecting the heat dissipation pattern 4 to the FPC 3, temperature rise of the driver ICs 2 can be restricted.

Furthermore, the provision of the heat dissipation pattern 4 helps to achieve more uniform thermal distribution of the crystal display panel 1 at the locations adjacent to the driver ICs 2 and distant from them, thereby suppressing degradation in display quality due to display irregularity that is caused from localized heat generation of the liquid crystal panel 1.

Other Embodiments

Figure 3:
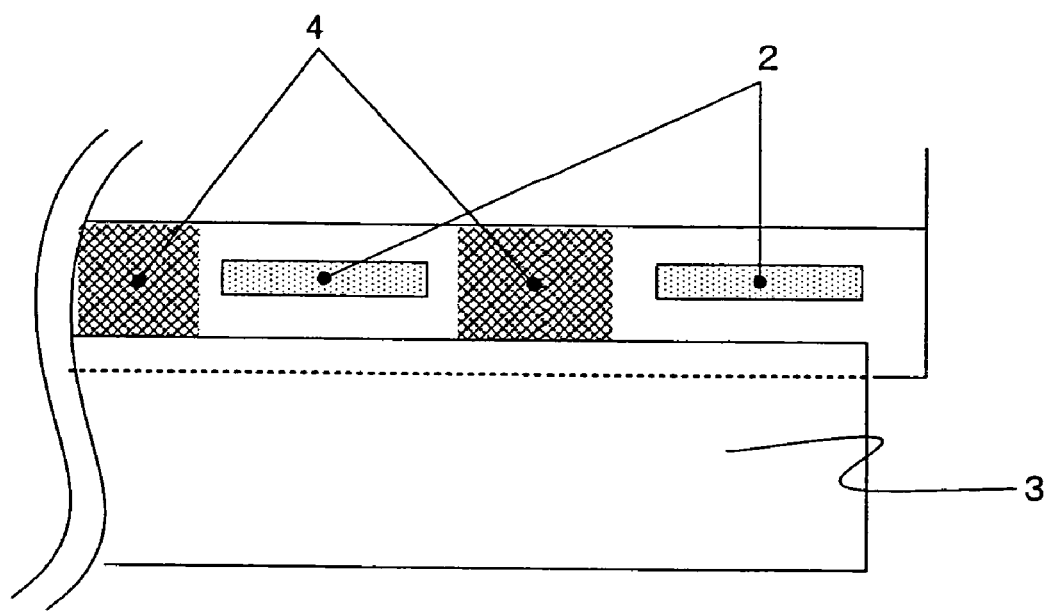
FIG. 3 is a second embodiment showing in a magnified scale a part adjacent to the driver ICs as shown in FIG. 1.

FIG. 3 is a second embodiment showing in a magnified scale a part adjacent to the driver ICs 2 as shown in FIG. 1. As shown in FIG. 3, the heat dissipation pattern 4 of good thermal conductive performance is formed adjacent to the driver ICs 2 similarly to the first embodiment as shown in FIG. 2. However, different from FIG. 2, the heat dissipation pattern 4 is in an independent configuration that is not connected to either the driver ICs 2 or the FCP 3.

Figure 4:
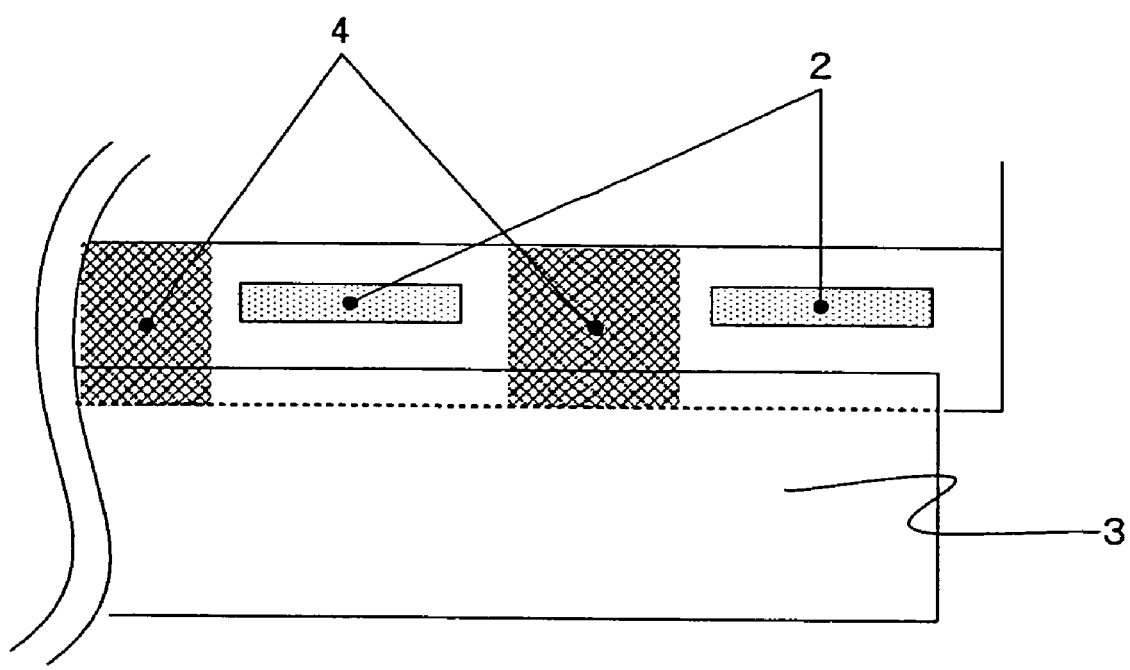
FIG. 4 is a third embodiment showing in a magnified scale a part adjacent to the driver ICs as shown in FIG. 1.

FIG. 4 is a third embodiment showing in a magnified scale a part adjacent to the driver ICs 2 as shown in FIG. 1. As shown in FIG. 4, the heat dissipation pattern 4 of good thermal conductive performance is formed at locations adjacent to the driver ICs 2 similarly to the first embodiment as shown in FIG. 2. However, although the heat dissipation pattern 4 is connected to the FPC 3, it is not connected to adjacent driver ICs 2 unlike the embodiment as shown in FIG. 2.

Figure 5:
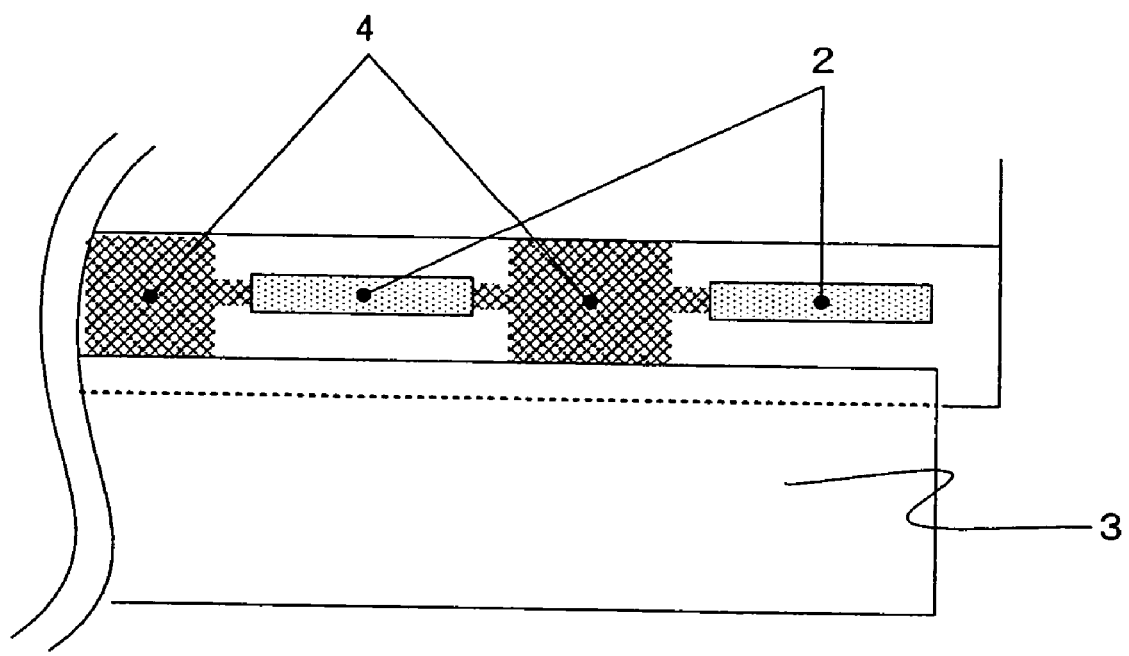
FIG. 5 is a fourth embodiment showing in a magnified scale a part adjacent to the driver ICs as shown in FIG. 1.

FIG. 5 is a fourth embodiment showing in a magnified scale a part adjacent to the driver ICs 2 as shown in FIG. 1. As shown in FIG. 5, although the heat dissipation pattern 4 is formed adjacent to the driver ICs 2 similar to the embodiment as shown in FIG. 2, it is not connected to the FCP 3 unlike FIG. 2 but is connected to the adjacent driver ICs 2.

Although the heat dissipation patterns 4 of the embodiments as shown in FIGS. 3 to 5 exhibit less effective heat dissipation performance as compared to that of the first embodiment, formation of the heat dissipation pattern 4 of good thermal conductive performance adjacent to the driver ICs 2 is effective to achieve more uniform thermal distribution between the driver ICs 2 as compared to prior art in which no heat dissipation pattern is formed. As a result, they are effective to reduce degradation of display quality such as display irregularity or the like due to localized heat generation of the liquid crystal panel 1.

As described hereinabove, it is to be noted that the heat dissipation pattern 4 may be made of the same material as the array of the liquid crystal panel 1, thereby significantly reducing the production cost of the liquid crystal display device.

Moreover, in the embodiments as shown in FIGS. 2 to 5, heat dissipation performance can be improved by forming wiring pattern of the driver ICs 2 by way of an insulation layer underneath the heat dissipation pattern 4 so that the heat generated by the driver ICs 2 can be easily conducted thereto.

Additionally, in the embodiments as shown in FIGS. 2 to 5, application of a fixed potential to the heat dissipation pattern 4 disposed adjacent to the driver ICs 2 helps to achieve more uniform thermal distribution of the liquid crystal panel 1, thereby effectively suppressing degradation of display quality such as display irregularity or the like due to localized heat of the liquid crystal panel 1.

Although various embodiments of the present invention have been described hereinabove, it is to be noted that such embodiments are simply examples and that the present invention should not be restricted only to such embodiments. A person having an ordinary skill in the art will be able to make various modifications depending on particular applications without departing from the scope and spirit of the present invention.

What is claimed is:

1. A liquid crystal display device having a generally rectangular liquid crystal panel and a circuit board connected to the liquid crystal panel on at least one side thereof, comprising:
    driver ICs mounted on a glass substrate of the liquid crystal panel at a spaced relationship along the one side for driving the liquid crystal panel; and
    discrete heat dissipation patterns formed on the glass substrate of the liquid crystal panel, the heat dissipation patterns being spaced from each other and adjacent to the driver ICs for conducting heat generated by the driver ICs, a first of the heat dissipation patterns located at a first side of one of the driver ICs, and a second of the heat dissipation patterns located at an opposite second side of the one of the driver ICs.

2. The liquid crystal display device of claim 1, wherein the heat dissipation patterns are in the form of films of a thermally conductive material.

3. The liquid crystal display device of claim 1, wherein the heat dissipation patterns are made from a same material as an array of the liquid crystal panel.

4. The liquid crystal display device of claim 1,
    wherein the heat dissipation patterns are made of a heat conductive electrically conductive material, and
    wherein a fixed potential is applied to the heat dissipation patterns.

5. The liquid crystal display device of claim 1, wherein the heat dissipation patterns are formed in such a manner to connect adjacent driver ICs.

6. The liquid crystal display device of claim 1, wherein the heat dissipation patterns are formed in such a manner to be connected to the circuit board.

7. The liquid crystal display device of claim 1, wherein the heat dissipation patterns are formed in such a manner to connect adjacent ICs and the circuit board.

8. The liquid crystal display device of claim 1, wherein a wiring pattern for the driver ICs is formed by way of an insulation layer underneath the heat dissipation patterns.

9. A liquid crystal display device having a generally rectangular liquid crystal panel and a circuit board connected to the liquid crystal panel on at least one side thereof, comprising:
    driver ICs for driving the liquid crystal panel, the driver ICs mounted at a spaced relationship on a glass substrate of the liquid crystal panel; and
    a plurality of discrete and separate heat dissipation patterns formed on the glass substrate of the liquid crystal panel, the heat dissipation patterns being spaced from each other and each heat dissipation pattern being adjacent to a driver IC for conducting heat generated by the driver ICs,
    wherein a first heat dissipation pattern and a second heat dissipation pattern are located, respectively, at a first side and an opposite second side of one of the driver ICs.

10. The liquid crystal display device of claim 9, wherein the heat dissipation patterns are directly connected to adjacent driver ICs.

11. The liquid crystal display device of claim 9, wherein the heat dissipation patterns are directly connected to the circuit board.

12. The liquid crystal display device of claim 9, wherein the heat dissipation patterns are directly connected to adjacent driver ICs and directly connected to the circuit board.

13. The liquid crystal display device of claim 9, wherein the heat dissipation patterns are formed of a film of thermally conductive material.

14. The liquid crystal display device of claim 9, wherein the heat dissipation patterns are made from a same material as an array of the liquid crystal panel.

15. The liquid crystal display device of claim 9, wherein the heat dissipation patterns are made of a heat conductive electrically conductive material.

16. The liquid crystal display device of claim 15, wherein a fixed potential is applied to the heat dissipation patterns.

17. The liquid crystal display device of claim 9, wherein a wiring pattern of the driver ICs is formed by way of an insulation layer underneath the heat dissipation patterns.

* * * * *